(12) United States Patent
Bradley et al.

(10) Patent No.: US 7,447,602 B1
(45) Date of Patent: Nov. 4, 2008

(54) SYSTEM AND METHOD FOR SORTING PROCESSORS BASED ON THERMAL DESIGN POINT

(75) Inventors: Douglas H. Bradley, Austin, TX (US); Jonathan J. DeMent, Austin, TX (US); Sang H. Dhong, Austin, TX (US); Brian Flachs, Georgetown, TX (US); Gilles Gervais, Austin, TX (US); Yoichi Nishino, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/758,034

(22) Filed: Jun. 5, 2007

(51) Int. Cl.
*G01R 21/00* (2006.01)
*G01R 21/06* (2006.01)
(52) U.S. Cl. .......................................... 702/60; 702/61
(58) Field of Classification Search ................... 702/60, 702/61
See application file for complete search history.

(56) References Cited

U.S. PATENT DOCUMENTS 7,058,531 B2\* 6/2006 Appleyard et al. ............ 702/99
2002/0130712 A1\* 9/2002 Naffziger et al. ............ 327/544

OTHER PUBLICATIONS

U.S. Appl. No. 11/621,766, filed Jan. 10, 2007, DeMent et al.

\* cited by examiner

*Primary Examiner*—Michael P Nghiem
(74) *Attorney, Agent, or Firm*—Stephen J. Walder, Jr.; D'Ann N. Rifai

(57) ABSTRACT

A system and method for sorting processor chips based on a thermal design point are provided. With the system and method, for each processor chip, a high power workload is run on the processor chip to determine a voltage regulator module (VRM) load line. Thereafter, a thermal design point (TDP) workload is applied to the processor chip and the voltage is varied until a performance of the processor chip falls on the VRM load line. At this point, the power input to the processor chip is measured and used to sort, or bin, the processor chip. The various workloads applied have a constant frequency. From this sorting of processor chips, high speed processors that require less voltage to achieve a desired frequency and low current processors that drain less current while running at a desired frequency may be identified.

20 Claims, 3 Drawing Sheets

SYSTEM AND METHOD FOR SORTING PROCESSORS BASED ON THERMAL DESIGN POINT

BACKGROUND

1. Technical Field

The present application relates generally to an improved data processing system and method. More specifically, the present application is directed to a system and method for sorting processors based on thermal design point.

2. Description of Related Art

When processor chips are fabricated, it is important to test the resulting processor chips to determine their operational characteristics. Such testing is important because, while the processor chips may all have the same design, various sources of error are present in the fabrication process which may cause the resulting processor chip to not operate exactly within the design parameters. By testing the processor chips after fabrication, the processors may be sorted according to their actual operating characteristics.

Traditionally, processors have been sorted by providing a fixed voltage and varying the frequency of the power supply. Essentially, the voltage is set and the frequency of the input power supply is varied until the processor fails. From this testing of the processor, it can be determined how fast the processor chip may operate before failure. Based on this information, the processor may be classified into a particular functional classification. Based on the functional classification, it can be determined which processors will meet the requirements of various customers' systems.

Recently, programmable voltage regulator modules have been used with processor chips in order to regulate the voltage supplied to the processor chip circuitry. The programmable voltage regulator modules allow for different operating voltages by way of their "programmability." As a result, it is possible to run a "fast" processor chip at a lower voltage than a "slow" processor chip operating at the same frequency as the "fast" processor chip. At a fixed frequency, there may be different customer demands for processor chips that have different power dissipation requirements related to the ability to dissipate heat in the resulting system in which the processor chip is utilized. Sorting processors according to frequency, as is generally known in the art, does not provide an adequate categorization mechanism for meeting such customer demands.

SUMMARY

The illustrative embodiments provide a system and method for sorting processor chips based on a thermal design point. The system and method, for each processor chip, performs workload based testing of a processor chip to define a voltage regulator module (VRM) load line. Thereafter, a thermal design point (TDP) workload is applied to the processor chip and the voltage is varied until a performance of the processor chip falls on the VRM load line. At this point, the power input to the processor chip is measured and used to classify, or bin, the processor chip.

More specifically, with the mechanisms of the illustrative embodiments, for a given processor chip, a first high power workload is run on the processor and the highest current drawn by the processor running an application that is not permitted to fail, i.e. the Imax, is determined. This first workload may be, for example, an Imax architecture verification program workload. Essentially, while the Imax AVP workload is running, the supply voltage of the workload is allowed to drop to a minimum value, i.e. the Vmin value below which proper chip operation cannot be guaranteed. The Imax value is measured at this Vmin value. Each chip has its own characteristic Vmin which is found by setting the frequency to a desired frequency and repeatedly running various tests to find the minimum voltage where these tests pass.

From the Vmin and Imax values, and the known Thevinin equivalent resistance value, R, of the voltage regulator module (VRM) of the processor, a voltage identifier (VID) for programming into the VRM is determined. The VID is determined by following a line from the (Imax, Vmin) point to an I=0 point, the line having a slope determined by the resistance value R of the voltage regulator module (R=V/I). Thus, from the VID, the Imax, and Vmin values, a VRM load line is identified. All points along this VRM load line between I=0 and I=Imax are valid operating points for the chip.

It should be noted that the VID is a variable that is assigned to each individual chip and thus, different chips manufactured from the same chip design may have different VIDs. Chips with different VIDs may have different current and therefore, different power and thermal design points (discussed hereafter). Typically, the VRM load line will have the same characteristic resistance regardless of the VID. Thus, the slope of the voltage drop with respect to current, i.e. the slope of the VRM load line, will be the same for all chips of the same chip design.

After defining the VRM load line, a second workload is run that represents the workload that must run continuously within the system without suffering cooling off periods. This second workload, for example, may be a thermal design point (TDP) architecture verification program. The supply voltage of this second workload is varied until a point on the VRM load line is achieved. The power consumed by the chip is then measured at this point and is used to classify the chip into a particular operating characteristic class of chips.

Based on the classification performed by the mechanisms of the illustrative embodiments, fast processor chips that require less voltage to achieve a desired frequency may be identified. Moreover, low current processor chips that drain less current while running at a desired frequency may be identified. Based on this identification, and customer specifications for processor chips that are to be incorporated into their data processing devices and systems, an appropriate processor chip for the customer's needs may be identified.

In one illustrative embodiment, a method is provided for sorting integrated circuit chips. The method may comprise obtaining a voltage regulator module (VRM) load line for an integrated circuit chip, applying a workload to the integrated circuit chip, and adjusting an on-chip voltage of the integrated circuit chip until a point within a given tolerance of the VRM load line is achieved. The method may further comprise measuring a power consumption of the integrated circuit chip in response to the point within the given tolerance of the VRM load line being achieved and sorting the integrated circuit chip into a predefined classification of integrated circuit chips based on the measured power consumption.

Obtaining the VRM load line may comprise determining a minimum voltage (Vmin) below which proper operation of the integrated circuit chip is not guaranteed and determining a maximum current (Imax) drawn by the integrated circuit chip while running a workload that is not permitted to fail. Obtaining the VRM load line may further comprise determining a voltage identifier (VID) for the integrated circuit chip based on the Vmin, Imax, and a resistance value associated with the VRM.

The workload that is applied to the integrated circuit chip may be a thermal design point (TDP) architecture verification program (AVP) workload. The TDP AVP may be specific to a particular application of the integrated circuit chip and may be based on the heat dissipation properties of a data processing device or system in which the integrated circuit chip is to be utilized.

A frequency of a power supply input to the integrated circuit chip may be maintained substantially constant during performance of the method. The VRM load line may be obtained by applying a high power workload test pattern to the integrated circuit chip and measuring a performance of the integrated circuit chip. Applying a workload to the integrated circuit chip may comprise applying a normal workload to the integrated circuit chip, the normal workload being a workload that must run continuously without suffering a cooling off period.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, a system for sorting integrated circuit chips is provided. The system may comprise a voltage regulator module coupled to an integrated circuit chip under test and a test apparatus coupled to the voltage regulator module and the integrated circuit chip under test. The test apparatus may perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

Figure 1A:
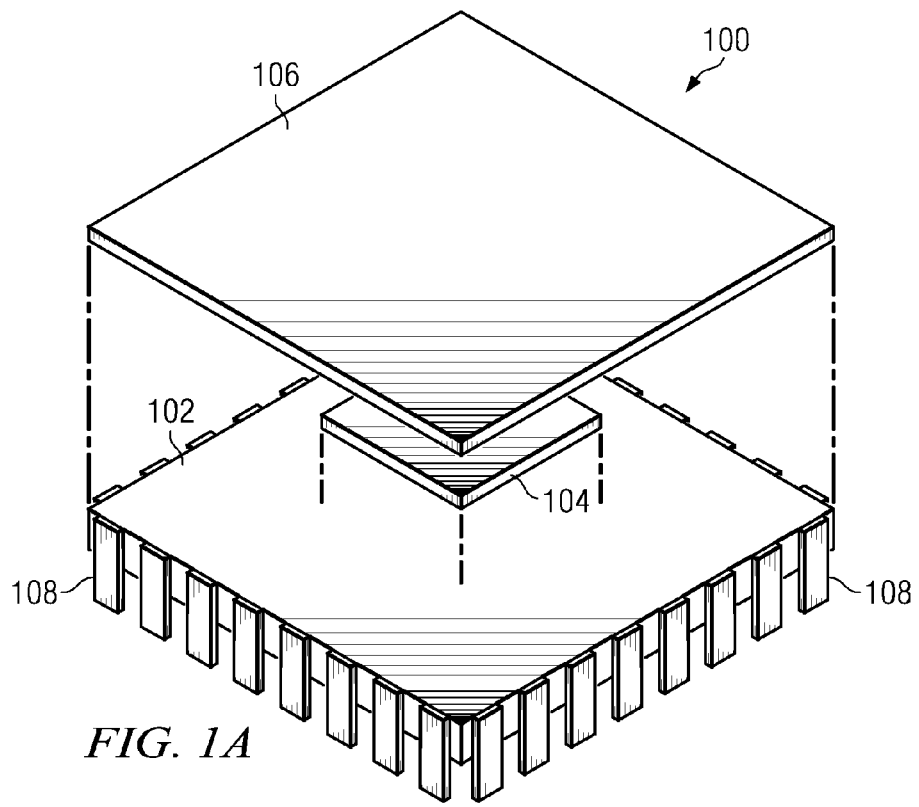
FIGS. 1A and 1B illustrate an example chip package assembly for which aspects of the exemplary embodiments may be implemented.
Figure 1B:
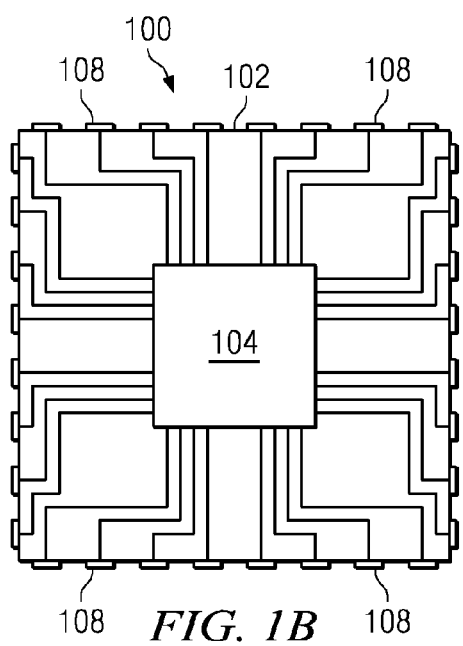

The illustrative embodiments provide a mechanism by which processor chips are sorted based on thermal design point testing. The illustrative embodiments may be used to sort any type of processor chip including PowerPC processor chips, processor chips used in the Cell Broadband Engine, and the like. FIGS. 1A and 1B are provided as an example chip package assembly with which aspects of the exemplary embodiments may be implemented. It should be appreciated that FIGS. 1A and 1B are only exemplary and are not intended to state or imply any limitation with regard to the types or configurations of processor chips with which the mechanisms of the illustrative embodiments may be utilized.

With reference to FIG. 1A, a package assembly 100 includes a die 104, which is placed on a package 102. A die is an unpackaged piece of silicon containing the functional components of a device. The term "die" is the formal term for the square of silicon containing an integrated circuit. A package is a housing that chips, or "dice" (plural of die), come in for plugging into or soldering onto printed circuit boards. The package 102 provides electrical wiring and connections to pins 108. The lid 106 covers the die 104 and bonds with the package 102.

The die 104 is bonded to the package 102 using, for example, solder, controlled collapse chip connection (C4), wire bond, or the like. A person of ordinary skill in the art will recognize that other package configurations may also be used, such as a flip-chip package configuration, for example.

Although the term "chip" is sometimes used to refer to an entire package assembly, the word "chip" is often used as a synonym for "die." Chip assemblies come in a variety of different types based on various developed technologies. A common chip package assembly is the dual in-line package (DIP). A DIP is a rectangular chip housing with leads (pins) on both long sides. Tiny wires bond the chip to metal leads that wind their way into spider-like feet that are inserted into a socket or soldered onto a circuit board.

A ceramic dual in-line package (CDIP) is a type of DIP chip made of ceramic materials. A CDIP package uses gold-plated leads attached to two sides by brazing and a metal lid bonded to the chip with a metal seal. A CERDIP uses a ceramic lid that is bonded to the chip with a glass seal.

A plastic leaded chip carrier (PLCC) package is a plastic, square, surface mount chip package that contains leads on all four sides. The leads (pins) extend down and back under and into tiny indentations in the housing.

A ceramic quad (CERQUAD) package is a square, ceramic, surface mount chip package. A CERQUAD package uses a ceramic lid that is bonded to the chip with a glass seal. A CERQUAD package has pins on all four sides that wrap under like those of a PLCC package. Other package types are known to those skilled in the art, and aspects of the illustrative embodiments may be applied to any chip type and any chip package type.

FIG. 1B illustrates a top-down, cross sectional view of a chip package assembly 100. The die 104 is surface mounted onto the package 102. As seen in FIG. 1B, the package 102 provides tiny wires to connect the components on the die 104 with the pins 108. The pins 108 provide connection to off-chip components. For example, if the die 104 is a processor chip, the pins 108 may provide connection to system memory or a system bus, for example.

One component that may be connected to the die 104 through one or more of pins 108 is a voltage regulator module. A voltage regulator module is a device or circuit that regulates the voltage fed to, typically, a microprocessor. The power supply of most personal computers generates power at 5 volts. However, most microprocessors require a voltage below 3.5 volts. The job of the voltage regulator module is to reduce the 5 volt signal to the lower voltage required by the microprocessor.

Figure 2:
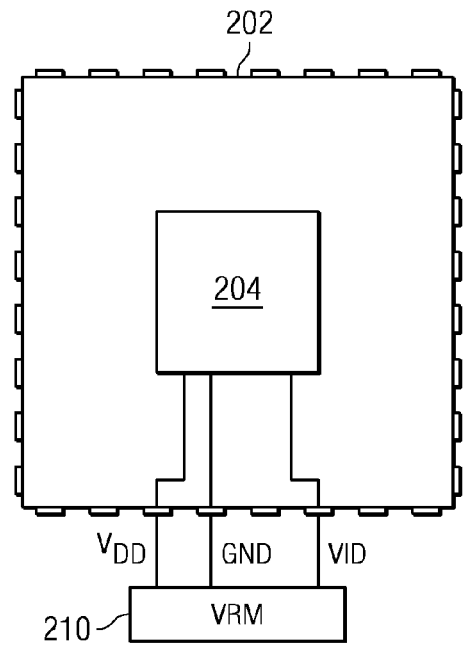
FIG. 2 illustrates a voltage regulator module connected to a chip through a package for which aspects of the illustrative embodiments may be applied.

FIG. 2 illustrates a voltage regulator module connected to a chip through a package with which aspects of the illustrative embodiments may be applied. In the depicted example, the die 204 may be, for instance, a microprocessor. The voltage regulator module (VRM) 210 is connected to the die 204 through the pins of the package 202. The voltage regulator module 210 may provide a supply voltage ($V_{DD}$) and a ground connection (GND).

The voltage regulator module 210 may be soldered to the motherboard to which the package 202 may also be soldered or connected using a socket mount. Alternatively, the voltage regulator module 210 may be an installable device. A voltage regulator module 210 allows processors with different supply voltages to be mounted on the same motherboard.

Some voltage regulator modules provide a fixed supply voltage to the processor. However, most voltage regulator modules sense the required supply voltage from the processor. In the depicted example, the microprocessor chip 204 communicates the correct supply voltage to the voltage regulator module 210 via a number of bits called the voltage identifier (VID). VIDs are discrete voltage values that are selected on a part-by-part basis during manufacturing tests to satisfy a single power and performance operating point for the part, such as a processor, for example. The VID is fused into VID logic on the part and is read when booting up the system in order to program the system voltage regulator module (VRM) setting.

With the mechanism of FIG. 2, the voltage regulator module 210 may initially provide a standard supply voltage to VID logic (not shown) within the microprocessor chip 204. The aim of the VID logic is to send the VID to the voltage regulator module 210. When the voltage regulator module 210 receives the VID identifying the required supply voltage, it starts acting as a voltage regulator, providing the required constant voltage supply ($V_{DD}$) to the processor.

The processor configuration in FIG. 2 may be a single-core microprocessor design. That is, the microprocessor in FIG. 2 may have only one central processor unit (CPU), also referred to as a "processor" or "core," or may have multiple processors or cores provided on a single processor chip. A single-core processor requires only one supply voltage, or perhaps two for a split-rail design where the processor is fed two voltages: the external or "I/O" voltage and the internal or "core" voltage. However, multiple core microprocessors may complicate the issue of power consumption due to having to consider the varying voltage supply requirements of the multiple processors or cores.

Processor manufacturers try to solve the concern about power consumption by using lower-power semiconductor processes and shrinking the die size, while still adding more and more functionality to the chip. As the die size shrinks and more components are packed into the processor design, variability in fabrication has a greater impact on performance and power consumption. Thus, it becomes more important to sort, or "bin," processors based on their operating characteristics. The same processor chip design may result in fabricated chips with differing operating characteristics due to these variances in the fabrication process. As a result, the same chip may not be suited for every customer application. It is important to sort the fabricated chips so that a when a customer sets forth their requirements for a chip in their data processing device or system, an appropriate chip may be selected for providing to the customer.

Because of the shrinking size of dies and the need to add more logic to the chip, heat dissipation of resulting chips becomes more of a concern as well. For example, the device or system that the chip is ultimately installed in may have a limited power dissipation level. When the processor chip operates above this level for an extended period of time, the chip temperature will exceed the device or system design limits. Before this occurs, power management mechanisms throttle the operation of the processor chip so as to reduce the power level. As a result, the delivered performance level is reduced to maintain the processor chip's temperature.

Customers desire to have unthrottled performance as much as possible for their use of the processor chips. Moreover, each customer may have different requirements for unthrottled performance, e.g., different processes to be executed by the processor chips for which unthrottled performance is desired. These processes are referred to as the thermal design point (TDP) architecture verification processes (AVPs).

Since modern customers are more concerned about power consumption and heat dissipation of processor chips now than they have been in the past, it is appropriate to classify processor chips in accordance with these performance characteristics. Using the traditional frequency based sorting or "binning" process does not provide satisfactory classification of processor chips with regard to these performance characteristics.

The illustrative embodiments provide a system and method for sorting processor chips based on a thermal design point. The system and method, for each processor chip, performs workload based testing of a processor chip to define a voltage regulator module (VRM) load line. Thereafter, a thermal design point (TDP) workload is applied to the processor chip and the voltage is varied until a performance of the processor chip falls on the VRM load line. At this point, the power input to the processor chip is measured and used to classify, or bin, the processor chip.

Figure 3:
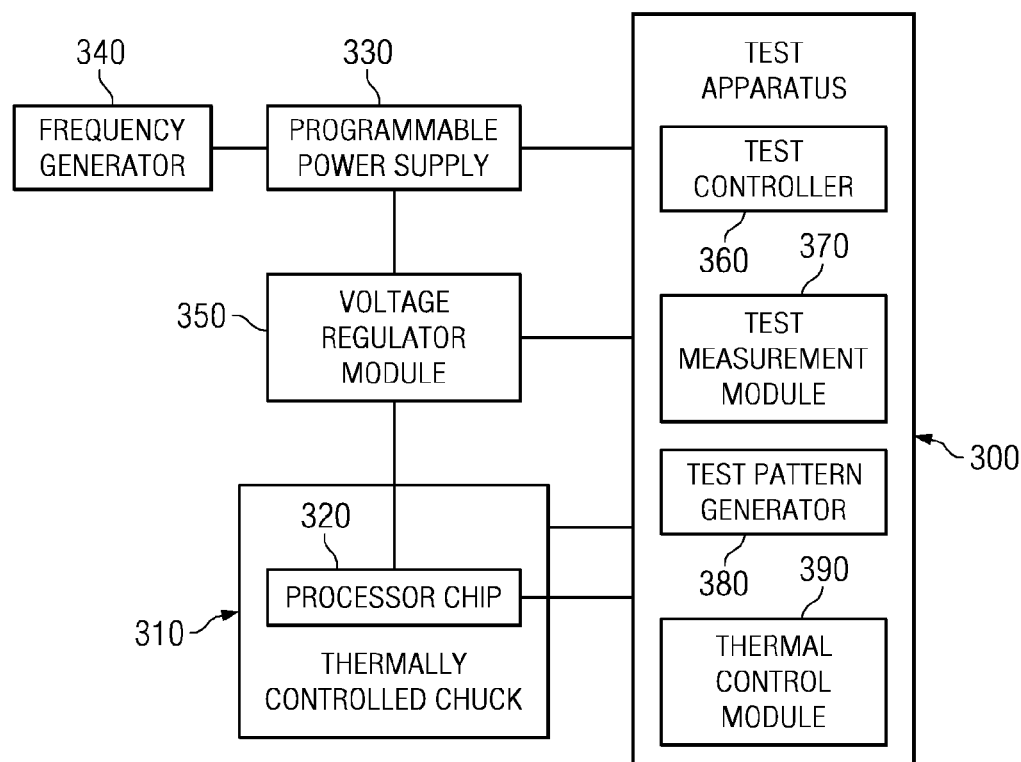
FIG. 3 is an exemplary block diagram of a testing mechanism in accordance with one illustrative embodiment.

FIG. 3 is an exemplary block diagram of a testing mechanism in accordance with one illustrative embodiment. As shown in FIG. 3, the testing mechanism includes a thermally controlled chuck 310 upon which a chip 320 to be tested is placed. Electrical connections may be provided via the chuck 310 so that appropriate signals are able to be provided to the chip 320 for testing and measurement purposes. Alternatively, other mechanisms for providing connections to the chip 320 may be provided as may be generally known in the art.

The chip 320 is coupled to a voltage regulator module 350 which in turn is coupled to a programmable power supply 330. The programmable power supply 330 is programmable by the frequency generator 340 to provide a desired frequency power input to the chip 320 via the voltage regulator module 350. With particular emphasis in the illustrative embodiments, the frequency generator 340 is used to control the frequency of the power input generated by the programmable power supply 330 so that a constant frequency is provided to the chip 320 during testing. In other words, for purposes of the testing of the illustrative embodiments, the frequency is fixed as opposed to traditional testing in which the frequency is purposefully made variable.

The test apparatus 300 is coupled to the chip 320, possibly via the chuck 310, and to the voltage regulator module 350 so as to provide appropriate control and test pattern signals to the chip 320 and to measure various performance characteristics in response to the test patterns and setting of the voltage regulator module 350. The test apparatus 300 includes a test controller 360, a test measurement module 370, a test pattern generator 380, and a thermal control module 390. The test controller 360 controls the overall operation of the test apparatus 300 and orchestrates the operation of the other elements 370-390.

The test pattern generator 380 applies various test patterns, under the control of the test controller 360, to the chip 320 so as to test the operation of chip 320 under various workloads. In particular, the test pattern generator 380 generates patterns for applying a high power workload to the chip 320 for determining a voltage regulator module load line. In addition, the test pattern generator 380 also generates patterns for applying a normal workload to the chip 320, the normal workload being a workload that must run continuously within the system in which the processor is to be placed without suffering a cooling off period.

The thermal control module 390 controls the temperature of the chuck 310 so that a substantially constant temperature is maintained at the chuck 310. The test controller 360 provides control signals to the voltage regulator module 350 so as to instruct the voltage regulator module 350 to vary the voltage of the power input applied to the chip 320 in accordance with a testing procedure, as discussed hereafter.

The test measurement module 370 measures the performance response of the chip 320 to the various test patterns and voltage inputs controlled by the test apparatus 300. The test measurement module 370 may measure, for example, the power consumption of the chip 320. Based on the measured power consumption, the chip 320 may be sorted or "binned."

With the mechanisms of the illustrative embodiments, the controller 360 instructs the test pattern generator 380 to apply a first high power workload test pattern to the chip 320. This first high power workload test pattern may be an Imax architecture verification program (AVP) that is used to determine the maximum current drawn by the processor running an application that is not permitted to fail. Essentially, the Imax value is determined when the applied workload causes the on-chip voltage to droop to a minimum voltage (Vmin) level below which proper operation of the chip is not guaranteed.

The controller 360 instructs the voltage regulator module 350 to permit the on-chip voltage to droop to minimum voltage (Vmin) level. Each chip design has its own Vmin value that is known prior to the application of the Imax AVP. The Vmin value may be found by setting the frequency of the power input to a desired frequency and repeatedly running various tests with varying on-chip voltages to find a minimum voltage where the tests pass. This is the minimum voltage Vmin that is used with the Imax AVP.

The test measurement module 370 measures the Imax value when the on-chip voltage equals, or is substantially equal to, the Vmin value for the chip. From the Vmin and Imax values, and the known Thevinin equivalent resistance value, R, of the voltage regulator module (VRM) of the processor, a VID for programming into the VRM is determined. The VID is determined by following a line from the (Imax, Vmin) point to an I=0 point, the line having a slope determined by the resistance value R of the voltage regulator module (R=V/I). Thus, from the VID, the Imax, and Vmin values, a VRM load line is identified. All points along this VRM load line between I=0 and I=Imax are valid operating points for the chip.

As mentioned above, the VID is a variable that is assigned to each individual chip and thus, different chips manufactured from the same chip design may have different VIDs. Chips with different VIDs may have different current and therefore, different power and thermal design points. Typically, the VRM load line will have the same characteristic resistance regardless of the VID. Thus, the slope of the voltage drop with respect to current, i.e. the slope of the VRM load line, will be the same for all chips of the same chip design.

After defining the VRM load line, the test controller 360 instructs the test pattern generator 380 to apply a second test pattern for running a second workload that represents the workload that must run continuously within the system without suffering cooling off periods. This second workload is a thermal design point (TDP) architecture verification program (AVP). The TDP AVP may be keyed to a particular application of the chip 320, i.e. may be based on the heat dissipation properties of the data processing device or system in which the chip 320 is to be utilized, for example. Alternatively, the TDP AVP may be a generalized AVP that is used to test the chip 320 according to a predetermined standard.

The TDP represents the maximum amount of power the thermal solution in a computer system is required to dissipate. For example, a laptop's CPU cooling solution may be designed for a 20 W TDP, which means that it can dissipate the heat generated by 20 W without exceeding a maximum junction temperature. The TDP is typically not set to the most power the chip could ever draw, but rather the maximum power that the chip would draw when running real applications. This ensures the system will be able to handle all applications without exceeding its thermal envelope, i.e. without requiring a cooling solution to work for the maximum theoretical power which would cost more and would achieve no real benefit under actual operating conditions.

When applying this second workload, e.g., the TDP AVP, to the chip 320 via the test pattern generator 380, the test controller 360 may instruct the voltage regulator module 350 to vary the supply voltage. The resulting on-chip voltage may be monitored by the test measurement module 370 to determine when the on-chip voltage causes a current in the chip 320 such that the voltage and current produce a point on, or within a given tolerance of, the VRM load line. At this point, the test controller 360 instructs the test measurement module 370 to measure the power being consumed by the chip 320.

The measured power is then used by the controller 360 to provide an indication of a classification for the chip 320. For example, predetermined ranges, or "bins," of power consumption may be established into which chips are to be sorted or "binned." Based on the measured power, the test controller 360 may compare the measured power to these ranges or bins and identify in which range or bin the chip 320 is best classified. An indication of this classification may be presented, such as via a display, printed report, or any other suitable output mechanism, so that a user may know where to classify the chip 320.

Based on the classification performed by the mechanisms of the illustrative embodiments, fast processor chips that require less voltage to achieve a desired frequency may be identified. Moreover, low current processor chips that drain less current while running at a desired frequency may be identified. Based on this identification, and customer specifications for processor chips that are to be incorporated into their data processing devices and systems, an appropriate processor chip for the customer's needs may be identified.

Figure 4:
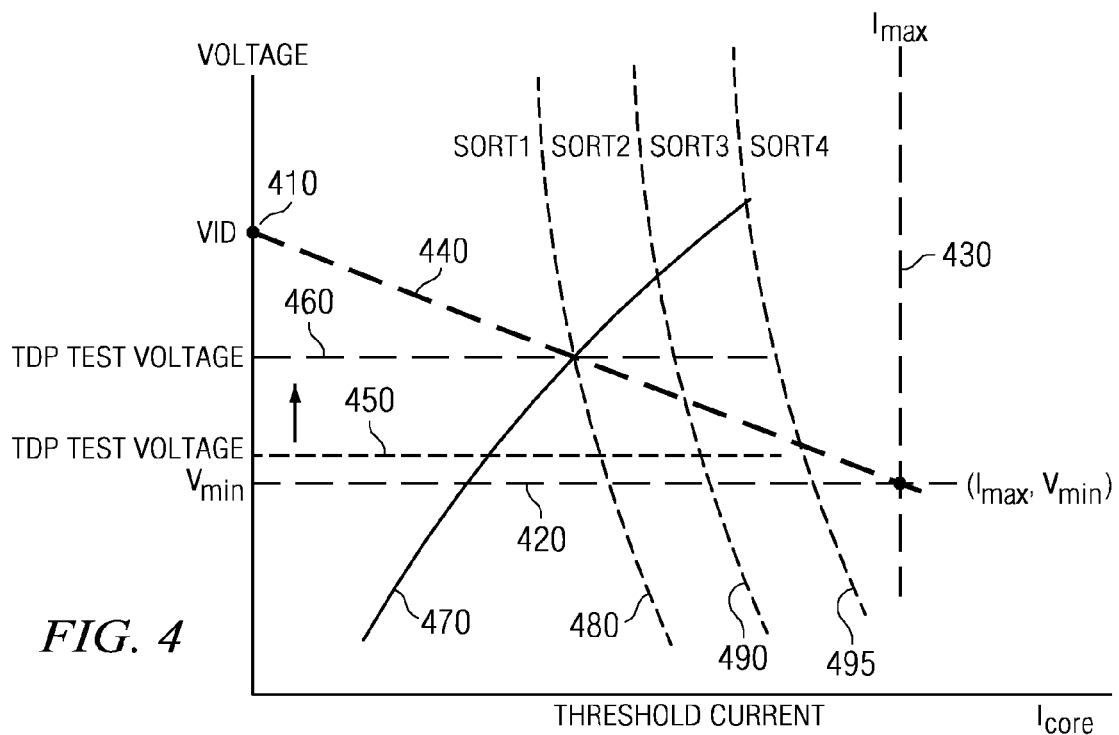
FIG. 4 is an exemplary graph illustrating a voltage regulator module load line and a manner by which the voltage regulator module load line is used to sort processor chips.

FIG. 4 is an exemplary graph illustrating a voltage regulator module load line and a manner by which the voltage regulator module load line is used to sort processor chips. As shown in FIG. 4, the threshold current (Icore) is provided along an X-axis of the graph while the on-chip voltage is provided along the Y-axis of the graph. Initially, in order to determine the VID 410, a Vmin 420 and Imax 430 for the chip are determined using a high power Imax AVP. First, the Vmin value 420 is determined by keeping the frequency constant at a desired frequency for the chip, and varying the voltage while performing tests on the logic of the chip to determine at what minimum voltage the tests pass. This Vmin value 420 is then used to determine the Imax value 430 by running the Imax AVP so as to allow the on-chip voltage to droop down to the Vmin value 420 at which point the threshold current is measured. This threshold current is then set as the Imax value 430.

From the Vmin value 420 and Imax value 430, a point (Imax, Vmin) in the graph may be identified and used as one end of the VRM load line 440 for the chip. Based on a Thevinin equivalent resistance R for the voltage regulator module (VRM), a line, i.e. the VRM load line 440, may be generated between the point (Imax, Vmin) and the point (0, VID) using the resistance R as the slope of the VRM load line 440. Points along this VRM load line 440 are valid operating points for the chip.

Thereafter, a normal workload, i.e. a thermal design point (TDP) architecture verification program (AVP) workload, is applied to the chip, the normal workload being a workload for which no cooling off periods should be required. The on-chip voltage is adjusted until a point on the VRM load line 440 is achieved. For example, the TDP AVP may be applied with the test voltage at a first level 450 and the voltage may be adjusted upwards until the test voltage and its corresponding threshold current result in a point on the VRM load line 440. The test voltage is an independent variable while the threshold current is a dependent variable. Thus, as the test voltage is adjusted, the threshold current is adjusted in accordance with the TDP $V_{DD}$–$I_{DD}$ curve 470.

Once the test voltage and threshold current result in a point on the VRM load line 440, or within a tolerance of the VRM load line 440, the power consumed by the chip is then measured and used to sort or "bin" the chip. As shown in FIG. 4, TDP contour lines 480-495 represent lines of constant power. Classifications, sorts, or "bins" may be established based on these cTDP contour lines 480-495 such that a range of TDP contour lines 480-495 may specify different classifications, sorts, or "bins" into which chips may be placed. For example, as shown in FIG. 4, four different "sorts" are established sort1-sort4. Based on whether the intersection point on the VRM load line 440 is within the range of one of these sorts, the chip will be classified within the corresponding sort.

As a result, if a customer wishes to use a particular chip design in the customer's data processing device or system, and has specific power dissipation limitations based on the design of the data processing device or system, the customer's power dissipation limitations may be used as a basis for determining which classification, sort, or bin of chips would satisfy the customer's needs. Those chips that have been classified, sorted, or binned into the corresponding classification, sort or bin may then be provided to the customer for use in his/her data processing device or system.

Figure 5:
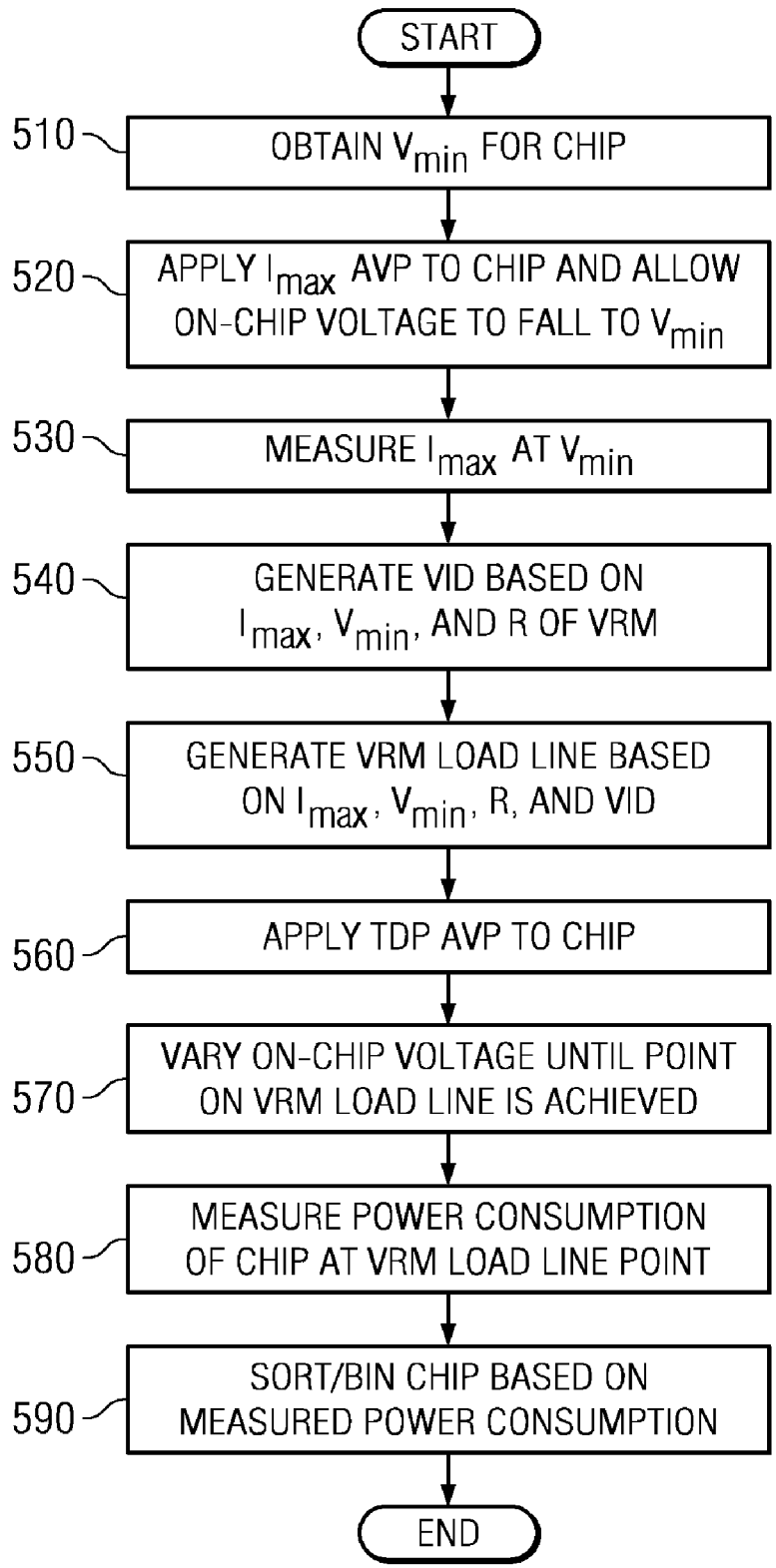
FIG. 5 is a flowchart outlining an exemplary operation in accordance with one illustrative embodiment.

FIG. 5 is a flowchart outlining an exemplary operation in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 5, the operation starts with the test system obtaining the Vmin for the chip (step 510). The Vmin may have already been determined by prior testing of the chip. In such a case, the Vmin for the chip may be provided as an input to the test system. Alternatively, the Vmin may be obtained by specifically testing the chip with the test system at this time. Such testing may involve, as discussed above, fixing the frequency of the chip and varying the on-chip voltage while testing the chip for proper function to thereby determine a lowest voltage at which proper function of the chip is achieved.

The test system applies a high power workload to the chip, e.g., an Imax AVP workload is applied to the chip, and the test system permits the on-chip voltage to fall to the established Vmin (step 520). Once the on-chip voltage is at the Vmin, or within a tolerance of the Vmin, the test system measures the threshold current of the chip uses this threshold current as the Imax value (step 530). Based on the Imax and Vmin values, along with a known resistance value R for the voltage regulator module (VRM), the test system generates the VID for the chip (step 540). From the VID, Imax, Vmin, and R values, the test system generates a VRM load line (step 550).

Having obtained the VRM load line, the test system applies a thermal design point (TDP) AVP to the chip (step 560). The test system varies the on-chip voltage until a point on the VRM load line is achieved (step 570). The test system then measures the power consumption of the chip at this VRM load line point (step 580). The test system then sorts/bins the chip based on the measured power consumption (step 590) and the operation terminates.

Thus, the mechanisms of the illustrative embodiments allow for the sorting/binning of chips, such as processor chips, based on power consumption rather than frequency as is generally used in the known art. Such sorting/binning based on power consumption provides an improved sorting methodology for customer applications where power dissipation is of great concern. Using the mechanisms of the illustrative embodiments, high speed chips that require less voltage to achieve a desired frequency may be identified. Moreover, low current chips that drain less current while running at the desired frequency may also be identified.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for sorting integrated circuit chips, comprising:
   obtaining a voltage regulator module (VRM) load line for an integrated circuit chip;
   applying a workload to the integrated circuit chip;
   adjusting an on-chip voltage of the integrated circuit chip until a point within a given tolerance of the VRM load line is achieved based on the applied workload;
   measuring a power consumption of the integrated circuit chip in response to the point within the given tolerance of the VRM load line being achieved; and
   sorting the integrated circuit chip into a predefined classification of integrated circuit chips based on the measured power consumption.

2. The method of claim 1, wherein obtaining the VRM load line comprises:
   determining a minimum voltage (Vmin) below which proper operation of the integrated circuit chip is not guaranteed; and
   determining a maximum current (Imax) drawn by the integrated circuit chip while running a workload that is not permitted to fail.

3. The method of claim 2, wherein obtaining the VRM load line further comprises:
   determining a voltage identifier (VID) for the integrated circuit chip based on the Vmin, Imax, and a resistance value associated with the VRM.

4. The method of claim 1, wherein the workload that is applied to the integrated circuit chip is a thermal design point (TDP) architecture verification program (AVP) workload.

5. The method of claim 4, wherein the TDP AVP is specific to a particular application of the integrated circuit chip and is based on the heat dissipation properties of a data processing device or system in which the integrated circuit chip is to be utilized.

6. The method of claim 1, wherein a frequency of a power supply input to the integrated circuit chip is maintained substantially constant during performance of the method.

7. The method of claim 1, wherein the VRM load line is obtained by applying a high power workload test pattern to the integrated circuit chip and measuring a performance of the integrated circuit chip, and wherein applying a workload to the integrated circuit chip comprises applying a normal workload to the integrated circuit chip, the normal workload being a workload that must run continuously without suffering a cooling off period.

8. A computer program product comprising a computer readable medium having a computer readable program, wherein the computer readable program, when executed on a computing device, causes the computing device to:
   obtain a voltage regulator module (VRM) load line for an integrated circuit chip;
   apply a workload to the integrated circuit chip; adjust an on-chip voltage of the integrated circuit chip until a point within a given tolerance of the VRM load line is achieved based on the applied workload;
   measure a power consumption of the integrated circuit chip in response to the point within the given tolerance of the VRM load line being achieved; and
   sort the integrated circuit chip into a predefined classification of integrated circuit chips based on the measured power consumption.

9. The computer program product of claim 8, wherein the computer readable program causes the computing device to obtain the VRM load line by:
   determining a minimum voltage (Vmin) below which proper operation of the integrated circuit chip is not guaranteed; and
   determining a maximum current (Imax) drawn by the integrated circuit chip while running a workload that is not permitted to fail.

10. The computer program product of claim 9, wherein the computer readable program further causes the computing device to obtain the VRM load line by:
    determining a voltage identifier (VID) for the integrated circuit chip based on the Vmin, Imax, and a resistance value associated with the VRM.

11. The computer program product of claim 8, wherein the workload that is applied to the integrated circuit chip is a thermal design point (TDP) architecture verification program (AVP) workload.

12. The computer program product of claim 11, wherein the TDP AVP is specific to a particular application of the integrated circuit chip and is based on the heat dissipation properties of a data processing device or system in which the integrated circuit chip is to be utilized.

13. The computer program product of claim 8, wherein a frequency of a power supply input to the integrated circuit chip is maintained substantially constant during performance of the method.

14. The computer program product of claim 8, wherein the VRM load line is obtained by applying a high power workload test pattern to the integrated circuit chip and measuring a performance of the integrated circuit chip, and wherein applying a workload to the integrated circuit chip comprises applying a normal workload to the integrated circuit chip, the normal workload being a workload that must run continuously without suffering a cooling off period.

15. A system for sorting integrated circuit chips, comprising:
a voltage regulator module coupled to an integrated circuit chip under test;
a test apparatus coupled to the voltage regulator module and the integrated circuit chip under test, wherein the test apparatus:
obtains a voltage regulator module (VRM) load line for the integrated circuit chip;
applies a workload to the integrated circuit chip;
instructs the voltage regulator module to adjust an on-chip voltage of the integrated circuit chip until a point within a given tolerance of the VRM load line is achieved based on the applied workload;
measures a power consumption of the integrated circuit chip in response to the point within the given tolerance of the VRM load line being achieved; and
sorts the integrated circuit chip into a predefined classification of integrated circuit chips based on the measured power consumption.

16. The system of claim 15, wherein the test apparatus obtains the VRM load line by:
determining a minimum voltage (Vmin) below which proper operation of the integrated circuit chip is not guaranteed; and
determining a maximum current (Imax) drawn by the integrated circuit chip while running a workload that is not permitted to fail.

17. The system of claim 16, wherein the test apparatus further obtains the VRM load line by:
determining a voltage identifier (VID) for the integrated circuit chip based on the Vmin, Imax, and a resistance value associated with the VRM.

18. The system of claim 15, wherein the workload that is applied to the integrated circuit chip is a thermal design point (TDP) architecture verification program (AVP) workload.

19. The system of claim 18, wherein the TDP AVP is specific to a particular application of the integrated circuit chip and is based on the heat dissipation properties of a data processing device or system in which the integrated circuit chip is to be utilized.

20. The system of claim 15, wherein a frequency of a power supply input to the integrated circuit chip is maintained substantially constant during performance of the method.

* * * * *